United States Patent
Gerber et al.

(10) Patent No.: US 6,847,102 B2
(45) Date of Patent: Jan. 25, 2005

(54) LOW PROFILE SEMICONDUCTOR DEVICE HAVING IMPROVED HEAT DISSIPATION

(75) Inventors: Mark A. Gerber, Austin, TX (US); Bennett A. Joiner, Austin, TX (US); Jose Antonio Montes De Oca, New Braunfels, TX (US); Trent A. Thompson, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/290,959

(22) Filed: Nov. 8, 2002

(65) Prior Publication Data

US 2004/0089922 A1 May 13, 2004

(51) Int. Cl.$^7$ .............................................. H01L 23/495
(52) U.S. Cl. ...................................... 257/668; 257/687
(58) Field of Search ................................ 257/668, 687, 257/666, 704

(56) References Cited

U.S. PATENT DOCUMENTS

| | | | |
|---|---|---|---|
| 4,633,573 A | * | 1/1987 | Scherer ........................ 29/841 |
| 5,376,588 A | * | 12/1994 | Pendse ........................ 156/293 |
| 5,436,203 A | | 7/1995 | Lin |
| 5,541,450 A | * | 7/1996 | Jones et al. .................. 257/697 |
| 5,625,222 A | | 4/1997 | Yoneda |
| 5,625,227 A | | 4/1997 | Estes |
| 5,894,108 A | | 4/1999 | Mostafazadeh |
| 5,923,084 A | | 7/1999 | Inoue |
| 6,011,315 A | * | 1/2000 | Toyosawa et al. ........... 257/783 |
| 2003/0042598 A1 | * | 3/2003 | Crane et al. ................. 257/710 |
| 2003/0218236 A1 | * | 11/2003 | Wright et al. ............... 257/668 |

FOREIGN PATENT DOCUMENTS

| EP | 1076361 A2 | 2/2001 |
|---|---|---|
| GB | 2373924 A | 10/2002 |

OTHER PUBLICATIONS

International Search Report PCT/US03/27436.

* cited by examiner

Primary Examiner—Phat X. Cao
(74) Attorney, Agent, or Firm—Daniel D. Hill; Joanna G. Chiu

(57) ABSTRACT

A package substrate (12, 52) has a first surface, a second surface opposite a first surface, and a cavity (22, 70) formed in the first surface that extends into the package substrate. The cavity has a cavity wall substantially perpendicular to the first and second surfaces. An integrated circuit die (20, 60) is placed in the cavity, and a conductive material (24, 72) is placed in the cavity to thermally couple an outer wall of the integrated circuit to the cavity wall. The conductive material improves the heat dissipation path between the integrated circuit die and the package substrate. The cavity may extend through the package substrate to the second surface such that the second surface of the package substrate is substantially coplanar to a surface of the integrated circuit die. An encapsulation layer (28, 78) may be formed over the conductive material, integrated circuit die, and at least a portion of the first surface of the package substrate.

14 Claims, 6 Drawing Sheets

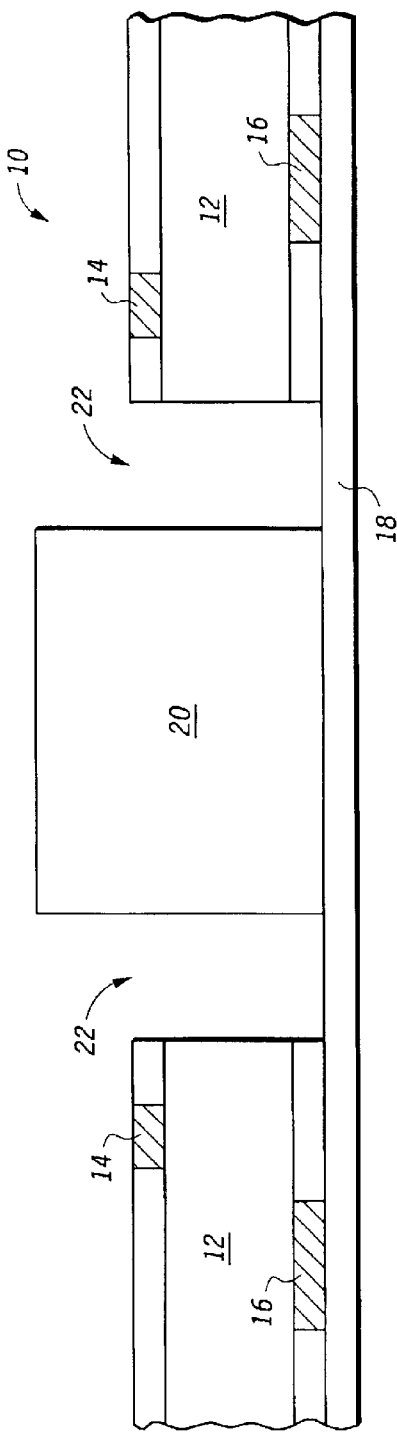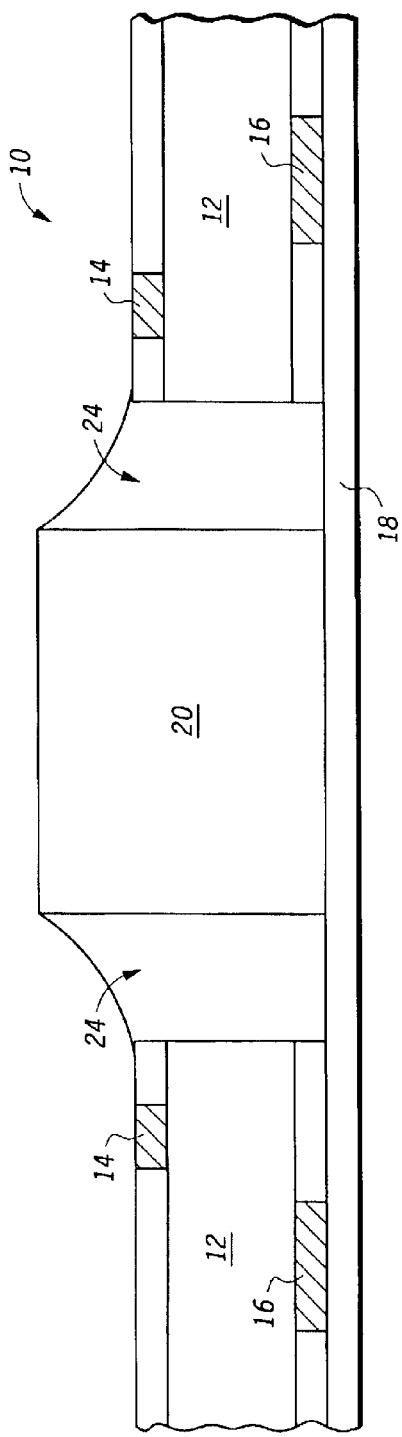

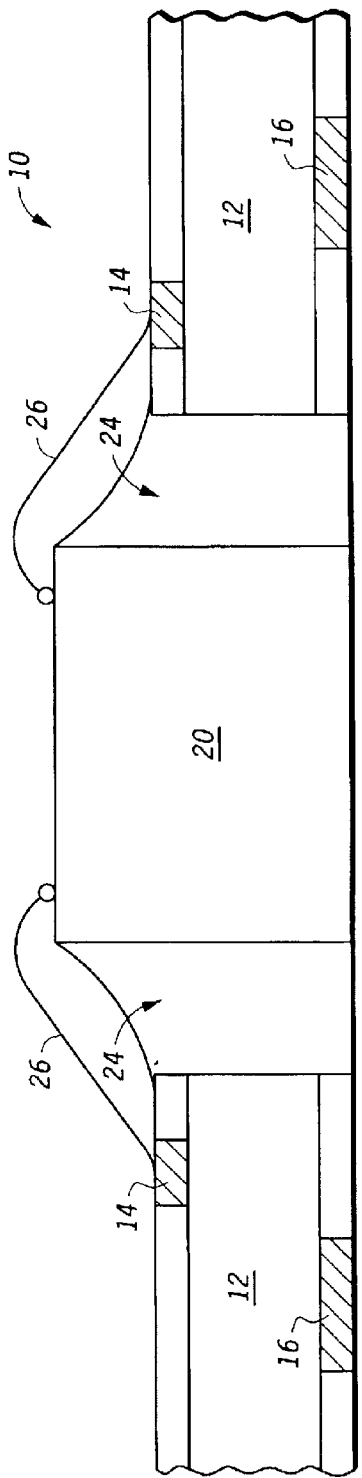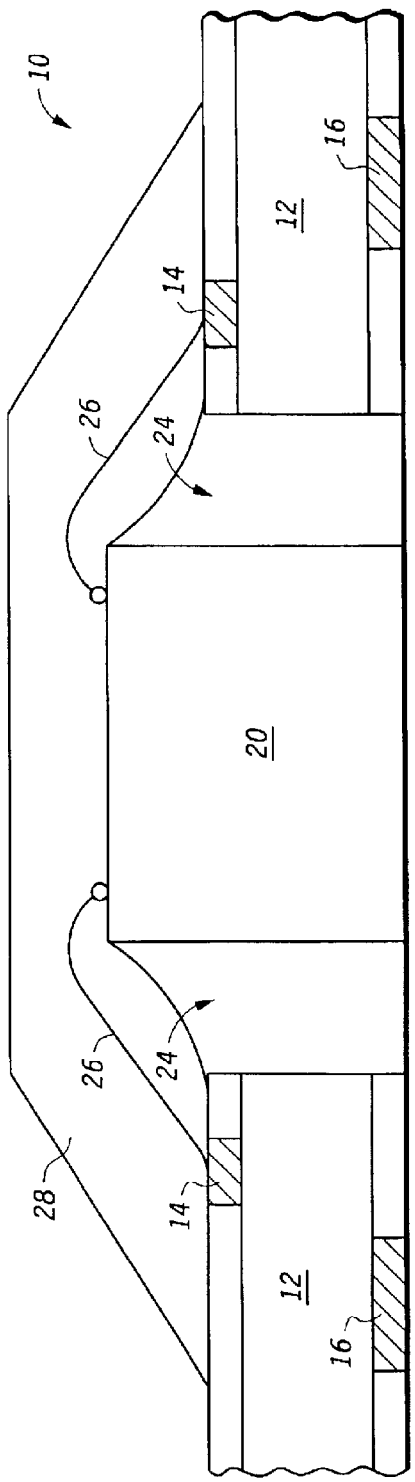

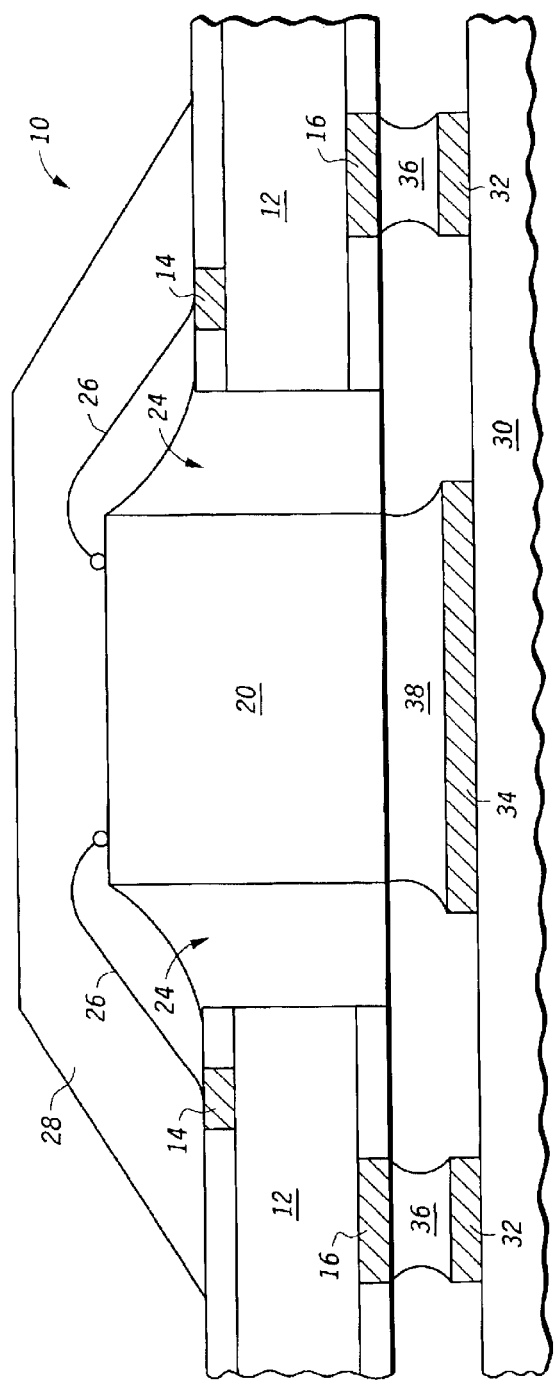
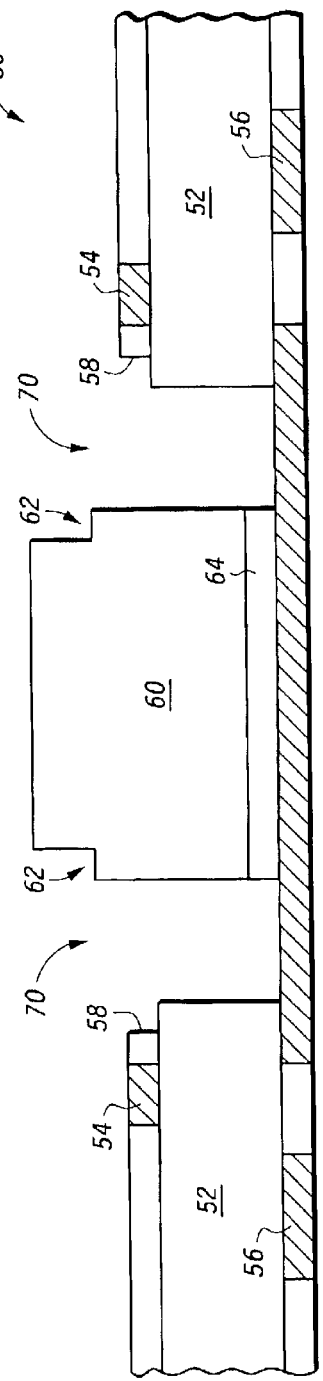
FIG. 5
FIG. 6

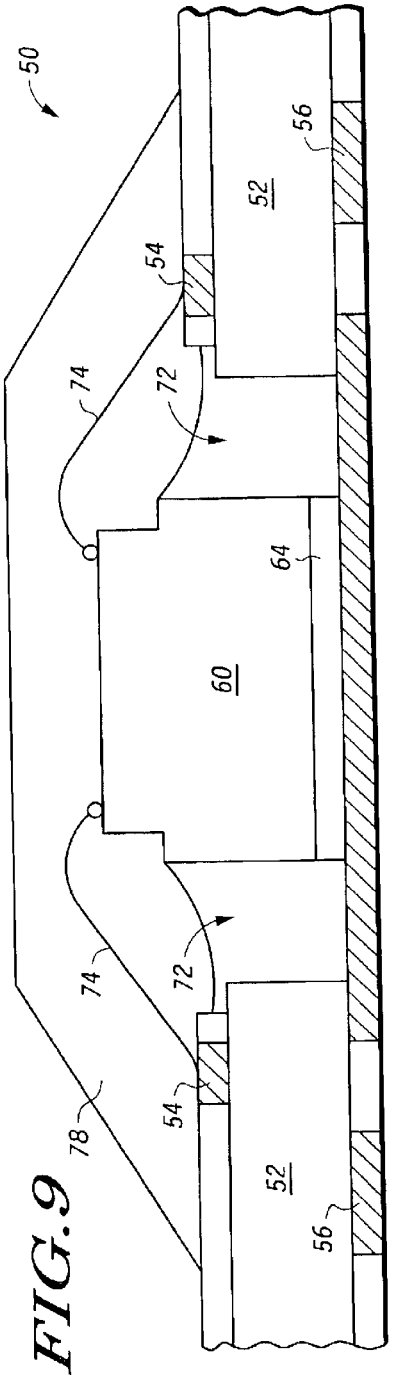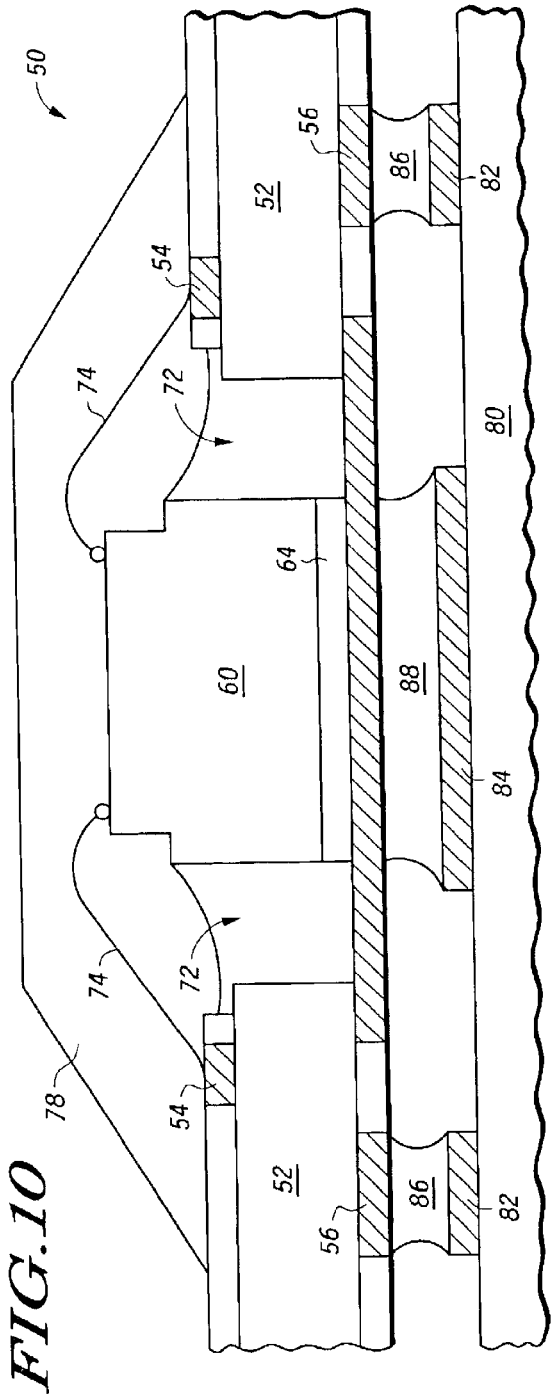

(12) United States Patent

LOW PROFILE SEMICONDUCTOR DEVICE HAVING IMPROVED HEAT DISSIPATION

FIELD OF THE INVENTION

The invention relates generally to a semiconductor device and more particularly to a package semiconductor device having improved thermal dissipation.

BACKGROUND

In packaging integrated circuits, it important to provide packages which allow for dissipation of heat that is generated by operation of the integrated circuit die. Generally, to remove the heat, a heat spreader is connected to a surface of the integrated circuit to allow the heat to be removed. The heat spreader may be a conductive portion of the package that is typically connected the bottom, or non-active surface, of the integrated circuit die. However, the addition of a heat spreader to the bottom of the die may increase the thickness of the package. In some applications, such as for example, a cellular telephone, a lower profile package is desirable to reduce the size of the phone. Therefore, it is desirable to have a low profile packaged integrated circuit while still having good thermal dissipation.

BRIEF DESCRIPTION OF THE DRAWINGS

The present invention is illustrated by way of example and not limitation in the accompanying figures, in which like references indicate similar elements, and in which:

FIGS. 1–5 include illustrations of sequential cross-sectional views of a package device formed in accordance with a first embodiment of the present invention; and FIGS. 6–10 include illustrations of sequential cross-sectional views of a package device formed in accordance with a second embodiment of the present invention.

Figure 7:
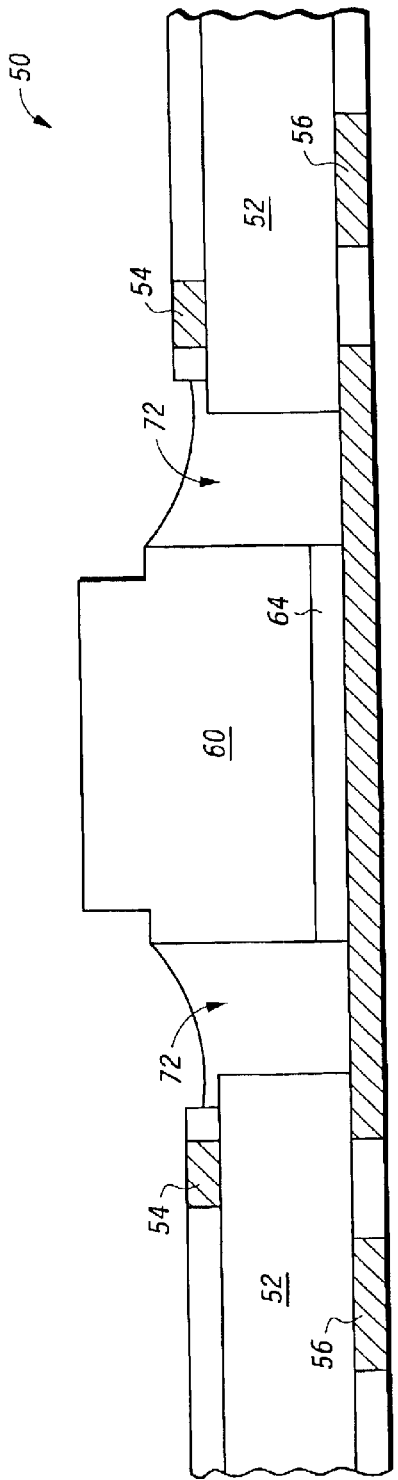

Skilled artisans appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

Generally, the present invention provides a low profile semiconductor device having improved heat dissipation, where a semiconductor die having active circuitry on one surface is positioned in a cavity of a package substrate. The package substrate has a first surface, and a second surface opposite the first surface. The cavity is formed in the first surface and extends into the package substrate. The cavity has a cavity wall substantially perpendicular to the first and second surfaces. The integrated circuit die has a first surface and a second surface opposite the first surface. An outer wall, or edge, of the die is substantially perpendicular to the first and second surfaces of the cavity. The die may be temporarily held in place using tape, or other temporary support. A conductive material is dispensed into the space between the die and the cavity wall. The conductive material thermally couples the outer wall of the die to the cavity wall. In one embodiment, the backside of the die is exposed when the temporary support is removed. In another embodiment, the package substrate cavity includes a heat spreader to function, at least in part, as a support during manufacture. By inserting the conductive adhesive between the die and the cavity wall, the package substrate functions as the heat spreader, while providing a low profile package.

FIGS. 1–5 include illustrations of sequential cross-sectional views of a package device formed in accordance with a first embodiment of the present invention.

FIG. 1 illustrates a semiconductor device 10 in accordance with one embodiment of the present invention. Semiconductor device 10 includes a package substrate 12 and a semiconductor die 20. The package substrate includes a top surface having a plurality of wire bond pads 14 and a cavity 22. A bottom surface of substrate 12 includes pads 16. Pads 16 are conductive and may be used for a variety of purposes. For example, pads 16 may be used to mount discrete devices, may be used to receive test probes for testing purposes, or may be used to receive conductive interconnects (e.g. solder balls). FIG. 1 also illustrates a temporary support 18 that is applied to the bottom of substrate 12. In the illustrated embodiment, temporary support 18 is a tape coated with an adhesive on one side that attaches temporary support 18 to the substrate. In one embodiment of the present invention, substrate 12 contains electrical conductors such as traces and vias that may be used to interconnect one or more die to external contacts (not shown). In addition, substrate 12 may include multiple internal metal layers (not shown).

A die 20 is placed on top of temporary support 18 in the center of cavity 22 with the bottom surface of die 20 affixed to temporary support 18. Temporary support 18 is used as a supporting member to fix die 20 within cavity 22 during subsequent manufacturing steps. Note that a die attach material may be used on the bottom of die 20 but is not shown in FIG. 1. Temporary support 18 may or may not extend over the entire bottom surface of substrate 12. Note that in the illustrated embodiment, the top surface of die 20 extends out of cavity 22 and above the surface of substrate 12. However, in other embodiments, die 20 may be entirely within cavity 22.

FIG. 2 illustrates semiconductor device 10 after conductive material 24 is dispensed in the space between the wall of cavity 22 and die 20. In the illustrated embodiment, conductive material 24 is a conductive epoxy based adhesive. For example, conductive material 24 may be a silver filled epoxy. As illustrated in FIG. 2, conductive material 24 completely fills cavity 22 and optionally overlaps the top surface of substrate 12. However, reasonable thermal performance may be achieved if the cavity is only substantially filled.

FIG. 3 illustrates semiconductor device 10 after wire bonds 26 are attached between pads 14 and pads on die 20 (not shown). Note that temporary support 18 may be removed before attaching wire bonds 26 or after the encapsulation step illustrated below in FIG. 4.

FIG. 4 illustrates semiconductor device 10 after encapsulation. An encapsulation material 28 can be applied by one of transfer molding, glob top dispensing, or other encapsulation method. Note that the thermal conductivity of the conductive material 24 is greater than the thermal conductivity of the encapsulation material 28.

FIG. 5 illustrates semiconductor device 10 being attached to a printed circuit board (PCB) 30. Electrical connections can be made between semiconductor device 10 and PCB 30 in a number of ways. FIG. 5 illustrates a land grid array using screen printed solder 36 to connect pads 32 in PCB 30 to pads 16 on substrate 12. Screen printed solder 38 is used to connect the exposed backside of die 20 to a pad 34. One skilled in the art will realize that the backside of die 20 will need a solderable surface in order to connect the exposed backside of die 20 in this manner. Alternately, thermally conductive underfill or interface material may be used if the backside of die 20 does not have a solderable surface or the use of solder is undesirable in a particular application. In the embodiment of FIG. 5, heat generated during operation of die 20 will be conducted through connection 38 and through conductive material 24. The heat spread via conductive material 24 to package substrate 12 will be conducted to PCB 30 through connections 36. Heat conducted through conductive material 24 to substrate 12 will also be dissipated from the top of the packaged integrated circuit device. Heat spreading to the package substrate through conductive material 24 provides a substantial enhancement over the thermal performance that can be achieved by conduction through connection 38 alone. In another embodiment, connection 38 may be omitted and heat will be conducted via conductive material 24 to substrate 12 and PCB 30, allowing for improved thermal conduction, easier printed circuit board assembly, reduced cost and a lower profile device compared to presently available lower profile packages.

FIGS. 6–10 include illustrations of sequential cross-sectional views of a package device formed in accordance with a second embodiment of the present invention.

FIG. 6 illustrates a semiconductor device 50 in accordance with another embodiment of the present invention. Semiconductor device 50 includes a package substrate 52 and a semiconductor die 60. The package substrate includes a top surface having a plurality of wire bond pads 54 and a cavity 70. A bottom surface of substrate 52 includes pads 56. Pads 56 are conductive and may be used for a variety of purposes. For example, pads 56 may be used to mount discrete devices, may be used to receive test probes for testing purposes, or may be used to receive conductive interconnects (e.g. solder balls). FIG. 6 also illustrates substrate 52 having an integral die attach pad extending across a bottom of cavity 70. A solder mask ridge 58 is formed at the top edge of the cavity wall. In the illustrated embodiment, the integral die attach pad is formed from a conductive material, such as for example, copper. In one embodiment of the present invention, substrate 52 contains electrical conductors such as traces and vias that may be used to interconnect one or more die to external contacts (not shown). In addition, substrate 52 may include multiple internal metal layers (not shown).

A die 60 is placed in the center of cavity 70 with the bottom surface of die 60 affixed to the integral die attach pad with die attach material 64. Integrated circuit die 60 has a top, or active, surface and a bottom surface opposite the top surface. An outer wall, or edge, of the die is substantially perpendicular to the first and second surfaces of the cavity. In one embodiment, the bottom surface of the integrated circuit die is substantially coplanar with the bottom surface of the package substrate. Die 60 includes ledge portions 62 cut into a top edge of the active surface. In one embodiment, ledge portions 62 may be formed at the time the wafer is sawed into multiple die. Ledge portions 62 result from a two-step sawing process. In the first step, a wider saw blade is used to make a first, partial, cut. In the second step, a second cut, started in the first partial cut, using a narrower saw blade completes separating the wafer into multiple die. Note that ledge portions 62 may be formed in other ways in other embodiments.

Substrate 52 includes a solder mask ridge 58 along a perimeter of cavity 70. The solder mask ridge is deposited to prevent the dispensed conductive material 72 from covering pads 54.

FIG. 7 illustrates semiconductor device 50 after conductive material 72 is dispensed in the space between the wall of cavity 70 and die 60. In the illustrated embodiment, conductive material 72 is a conductive epoxy based adhesive and conductively bonds the edge, or outer wall, of die 60 to the wall of cavity 70. For example, conductive material 72 may be a silver filled epoxy. As illustrated in FIG. 7, conductive material 72 fills cavity 70 up to ledge 62 on die 60 and solder mask ridge 58 on substrate 52. Solder mask ridge 58 functions to keep conductive material 72 from inadvertently covering wire bond pads 54. Likewise, ledge 62 functions to prevent conductive material 72 from covering the active surface of die 60.

Figure 8:
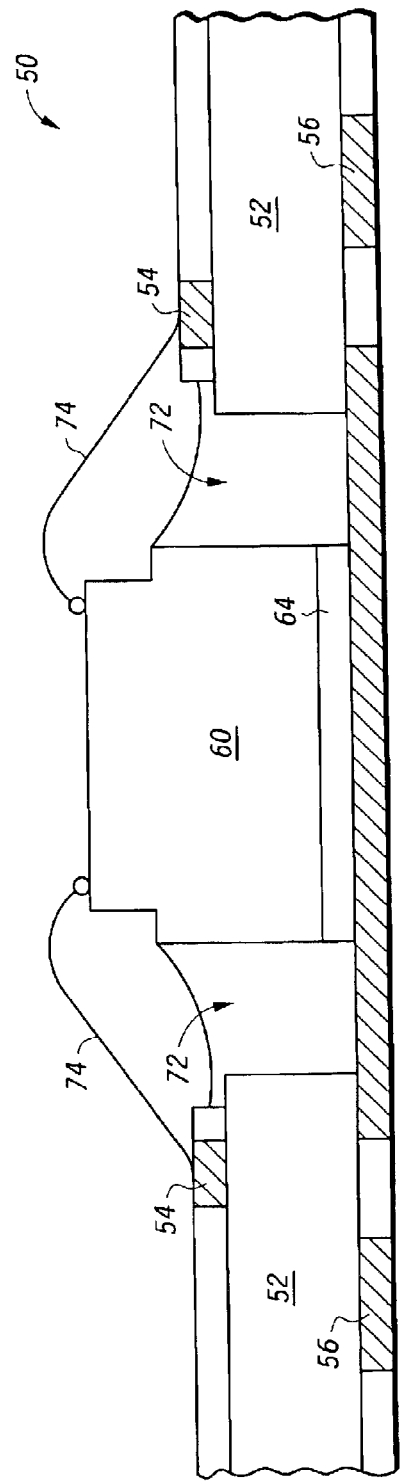

FIG. 8 illustrates semiconductor device 50 after wire bonds 74 are attached between pads 54 and pads on die 60 (not shown).

FIG. 9 illustrates semiconductor device 50 after encapsulation. An encapsulation material 78 may be applied by one of transfer molding, glob top dispensing, or other encapsulation method. Note that the thermal conductivity of conductive material 72 is greater than the thermal conductivity of the encapsulation layer.

FIG. 10 illustrates semiconductor device 50 being attached to a printed circuit board (PCB) 80. Electrical connections can be made between semiconductor device 50 and PCB 80 in a number of ways. FIG. 10 illustrates a land grid array using screen printed solder 86 to connect pads 82 in PCB 80 to pads 56 on substrate 52. Optionally, screen printed solder 88 is used to connect the bottom of substrate 52 to a pad 84. Alternately, thermally conductive underfill, or interface material, may be used if the bottom of substrate 52 does not have a solderable surface or the use of solder is undesirable in a particular application.

In the embodiment of FIG. 10, heat generated during operation of die 60 will primarily be conducted through connection 88 and through conductive material 72. Heat may also be conducted via integral die pad to conductive material 72. The heat spread via conductive material 72 to package substrate 52 will be conducted to PCB 80 through connections 86. Heat conducted through conductive material 72 to substrate 52 will also be dissipated from the top of the packaged integrated circuit device. Heat spreading to the package substrate through conductive material 72 is enhanced over the thermal performance that can be achieved by conduction through connection 88 alone. In another embodiment, connection 88 may be omitted and heat will be conducted via conductive material 72 to substrate 52 and PCB 80, allowing for easier printed circuit board assembly and reduced cost in a lower profile device with improved thermal performance.

Figure 11:
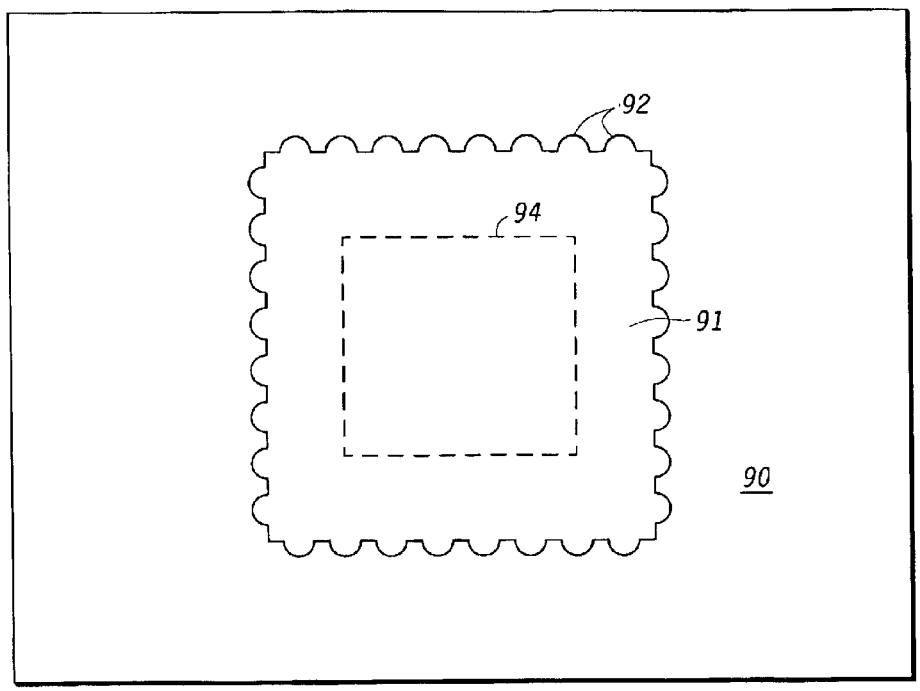
FIG. 11 illustrates a top down view of a package substrate for use in the first and second embodiments of the present invention.

FIG. 11 illustrates a top down view of a package substrate 90 intended for use in the first and second embodiments of the present invention. For example, substrate 90 may be substituted for substrate 12 in the embodiment illustrated in FIG. 1–FIG. 5, or substrate 52 illustrated in FIG. 6–FIG. 10. Package substrate 90 includes a cavity 91 for receiving a die 94. The walls of cavity 91 have a plurality of plated cut-out portions 92. In one embodiment, the plated cut-out portions 92 are formed by drilling holes spaced along a line defining the cavity wall. The holes are then plated with a conductive material, such as for example, nickel or copper. In other embodiments, the holes may be plated with other thermally conductive materials. The cavity is routed leaving half of the plated via as illustrated. Conductive material dispensed in the cavity forms a conductive connection between the die and the plated cut-out out portions. Substrate 90 provides enhanced thermal coupling to the conductive internal planes (not shown) in substrate 90 because there is a direct metal connection established between the plated vias and the internal planes. Alternately, the walls of the cavity may be plated without using vias to provide a similar result.

Note that traces and vias (not shown) within substrate 90 are used to selectively interconnect various portions of substrate 90.

Note also that die attach materials may be any type of appropriate material, such as, for example, adhesive tape or non-solid adhesive (e.g. glue, epoxy). Dies 20 and 60 may be any type of integrated circuit, semiconductor device, or other type of electrically active substrate. Alternate embodiments of the present invention may have any number of die 20 or 60 packaged within a package device. For example, alternate embodiments may package more than one die in a package device.

In the foregoing specification the invention has been described with reference to specific embodiments. However, one of ordinary skill in the art appreciates that various modifications and changes can be made without departing from the scope of the present invention as set forth in the claims below. For example, any appropriate die attach processes, wire bond processes, and tape processes may be used in the formation of the illustrated embodiments, of which there are many known in the art. Also, a lead frame may be substituted for the substrate. Accordingly, the specification and figures are to be regarded in an illustrative rather than restrictive sense, and all such modifications are intended to be included within the scope of the present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any of the claims.

What is claimed is:

1. A semiconductor device comprising:
   a package substrate having a first surface, a second surface opposite the first surface, and a cavity formed in the first surface and extending into the package substrate, the cavity having a cavity wall substantially perpendicular to the first and second surfaces;
   an integrated circuit die, wherein at least a portion of the integrated circuit die is in the cavity, and wherein the integrated circuit die has a first surface, a second surface opposite the first surface, an outer wall substantially perpendicular to the first and second surfaces, a ledge portion at an intersection of the first surface of the integrated circuit die and the outer wall, wherein at least a portion of the outer wall substantially faces the cavity wall; and
   a conductive material in the cavity, wherein the conductive material thermally couples the outer wall of the integrated circuit die to the cavity wall.

2. The semiconductor device of claim 1, further comprising:
   an encapsulation layer overlying the first surface of the integrated circuit die, the conductive material, and at least a portion of the first surface of the package substrate.

3. The semiconductor device of claim 2, wherein the encapsulation layer comprises a material different from the conductive material.

4. The semiconductor device of claim 2, wherein a thermal conductivity of the conductive material is greater than a thermal conductivity of the encapsulation layer.

5. The semiconductor device of claim 1, wherein the conductive material substantially fills the cavity between the outer wall of the integrated circuit die and the cavity wall.

6. The semiconductor device of claim 1, wherein the integrated circuit die is entirely within the cavity.

7. The semiconductor device of claim 1, further comprising:
   a plurality of wire bonds extending from the first surface of the integrated circuit die to the first surface of the package substrate.

8. The semiconductor device of claim 1, wherein at least a portion of the cavity wall is plated with a second conductive material.

9. The semiconductor device of claim 8, wherein the cavity wall of the package substrate comprises a plurality of cut-out portions.

10. The semiconductor device of claim 1, wherein the package substrate comprises a solder mask ridge near an intersection of the first surface of the package substrate and the cavity wall.

11. The semiconductor device of claim 1, wherein the cavity extends through the package substrate from the first surface of the package substrate to the second surface of the package substrate.

12. The semiconductor device of claim 11, wherein the second surface of the integrated circuit die is substantially coplanar with the second surface of the package substrate.

13. The semiconductor device of claim 11, wherein the second surface of the integrated circuit die is capable of being coupled to a printed circuit board.

14. The semiconductor device of claim 1, wherein the conductive material bonds the outer wall of the integrated circuit die to the cavity wall.

* * * * *